(12) United States Patent
Young

(10) Patent No.: US 7,645,646 B2
(45) Date of Patent: Jan. 12, 2010

(54) MANUFACTURE OF ELECTRONIC DEVICES COMPRISING THIN-FILM CIRCUIT ELEMENTS

(75) Inventor: Nigel D. Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 688 days.

(21) Appl. No.: 10/525,173

(22) PCT Filed: Aug. 6, 2003

(86) PCT No.: PCT/IB03/03484

§ 371 (c)(1),
(2), (4) Date: Feb. 22, 2005

(87) PCT Pub. No.: WO2004/019123

PCT Pub. Date: Mar. 4, 2004

(65) Prior Publication Data

US 2006/0030084 A1 Feb. 9, 2006

(30) Foreign Application Priority Data

Aug. 24, 2002 (GB) ................... 0219771.3

(51) Int. Cl.
*H01L 21/339* (2006.01)
(52) U.S. Cl. ................ 438/145; 438/60; 438/75; 438/76; 257/E31.061; 257/E31.078; 257/E31.079; 257/E31.081; 257/E31.082; 257/E31.084; 257/E33.046; 257/E21.361; 257/E21.617

(58) Field of Classification Search ............. 435/155, 435/157, 154, 187, 190; 257/E27.113, E27.116, 257/E27.145, E27.141, E33.046, E31.061, 257/E21.361, E31.075, E31.078, E31.079, 257/E31.081, E31.082, E31.084, E27.153, 257/E27.154, E27.159, E27.16, E27.163, 257/E21.617, 27.116; 438/155, 157, 154, 438/187, 190, 210, 59, 164, 60, 65, 66, 69, 438/71, 74, 75, 78, 31, 39, 96, 145, 233, 438/76
See application file for complete search history.

(56) References Cited

U.S. PATENT DOCUMENTS 4,862,237 A * 8/1989 Morozumi .............. 257/72

(Continued)

FOREIGN PATENT DOCUMENTS

WO WO 0120591 A1 3/2001

(Continued)

OTHER PUBLICATIONS

Wolf et al., Silicon Processing for the VLSI Era, vol. 1: Process Technology, 1986 by Lattice Press, p. 179.*

*Primary Examiner*—Julio J Maldonado

(57) ABSTRACT

In the manufacture of an electronic device such as an active matrix display, a vertical amorphous PIN photodiode or similar thin-film diode (D) is advantageously integrated with a polysilicon TFT (TFT1, TFT2) in a manner that permits a good degree of optimization of the respective TFT and diode properties while being compatible with the complex pixel context of the display. High temperature processes for making the active semiconductor film (10) of the TFT more crystalline than an active semiconductor film (40) of the diode and for forming the source and drain doped regions (s1,s2, d1,d2) of the TFT are carried out before depositing the active semiconductor film (40) of the diode. Thereafter, the lateral extent of the diode is defined by etching while protecting with an etch-stop film (30) an interconnection film (20) that can provide a doped bottom electrode region (41) of the diode as well as one of the doped regions (s2, g1) of the TFT.

17 Claims, 7 Drawing Sheets

U.S. PATENT DOCUMENTS

| | | | | |
|---|---|---|---|---|
| 5,079,426 | A | * | 1/1992 | Antonuk et al. ......... 250/370.09 |
| 5,480,810 | A | * | 1/1996 | Wei et al. ....................... 438/59 |
| 6,027,960 | A | * | 2/2000 | Kusumoto et al. ........... 438/166 |
| 6,252,215 | B1 | * | 6/2001 | Mei et al. ................. 250/208.1 |
| 7,176,068 | B2 | * | 2/2007 | Kitakado et al. ............ 438/149 |

FOREIGN PATENT DOCUMENTS

| | | |
|---|---|---|
| WO | WO 0199190 A2 | 12/2001 |
| WO | WO 0199191 A1 | 12/2001 |

* cited by examiner

MANUFACTURE OF ELECTRONIC DEVICES COMPRISING THIN-FILM CIRCUIT ELEMENTS

This invention relates to methods of manufacturing an electronic device, for example an active matrix display, comprising thin-film circuit elements that include a diode integrated with a crystalline thin-film transistor, the transistor having a channel area in an active semiconductor film that is more crystalline than an active semiconductor film of the diode, for example an amorphous PIN photodiode. The invention also relates to such device structures themselves.

Examples of such devices in the form of active matrix electroluminescent displays are disclosed in published PCT patent applications WO-A-01/20591, WO-A-01/99190 and WO-A-01/99191, the whole contents of which are hereby incorporated herein as reference material. In these electroluminescent display devices, each pixel comprises:

- a light-emitting element, typically a light-emitting diode (LED) of organic semiconductor (for example, polymer semiconductor),
- at least two thin-film transistors (TFTs) of polycrystalline silicon (polysilicon), whereby the LED is driven via a first, drive TFT as addressed via the second, address TFT,
- a thin-film storage capacitor for storing the drive signal applied to the gate of the drive TFT via the address TFT, and
- a light-sensing element (for example, an amorphous PIN photodiode, or a photo-responsive polysilicon TFT) that is responsive to the LED output to provide optical feedback for regulating LED operation via the drive TFT (in order to counteract aging effects in the LED).

The present invention can be applied to, for example, the integration of the drive and/or address TFT with an amorphous PIN photodiode as the light-sensing element.

As illustrated in WO-A-01/20591, WO-A-01/99190, and WO-A-01/99191, the light-sensing element is connected:

- in parallel with the capacitor, between the gate of the drive TFT and its power supply line (source connection of the drive TFT), and
- between the drive signal output (drain electrode) of the address TFT and the power supply line (source connection of drive TFT).

In fabricating these display devices, it is generally convenient to form the light-sensing element using common technology and process steps with the TFTs. For this reason, it has been preferable to form the light-sensing element as a photo-sensitive TFT structure (having its gate of ITO or other transparent electrode material connected to its source), or possibly as a lateral PIN diode. In each case, the light-absorbing active semiconductor film of this photo-sensitive TFT structure or PIN diode is provided using the same technology and process steps as the drive and address TFTs of the pixel.

A disadvantage of this approach is that the active semiconductor film (that provides the channel area of the TFTs) is comparatively thin (for example, with a thickness in the range of 0.04 µm to 0.10 µm). An intrinsic silicon film of this thickness is not fully absorbing at the red end of the spectrum. As a result, different sized photo TFTs/diodes are required for red, green and blue pixels, and the photo TFT/diode for the red is particularly large, consuming useful aperture area. This problem is avoidable if vertical amorphous PIN diodes with thicker silicon are used as the light-sensing elements, but problems then arise as to how best to integrate such vertical diodes with the TFTs in a manner compatible with the display pixel layout.

Similar problems arise with other types of display, for example with the integration of photodiodes in pixels of an active matrix liquid-crystal display (AMLCD). The whole contents of U.S. Pat. No. 5,838,308 are hereby incorporated herein as reference material for an example of a need to integrate light-sensing elements in the pixels of an AMLCD for an optical input to the device.

It is an aim of the present invention to facilitate the integration of a thin-film diode (for example a vertical amorphous PIN photodiode) with a more crystalline thin-film transistor in a manner that permits a degree of optimisation of the respective diode and transistor properties, while using common process steps for their integration and while being compatible with even the complex pixel context of an active matrix display.

According to one aspect of the present invention, there is provided a method for the manufacture of such a device, that includes:

(a) forming on a circuit substrate the crystalline active semiconductor film for a channel area of the TFT, with a first process involving a first processing temperature;

(b) forming doped source and drain regions of the TFT at ends of the channel area with a second process involving a second processing temperature;

(c) providing an interconnection film between an electrode area of the TFT and a diode area over which the diode is to be formed, and providing an etch-stop film on which the active semiconductor film for the diode is to be deposited;

(d) thereafter depositing the active semiconductor film for the diode over the interconnection film and the etch-stop film with a third process that involves a third processing temperature, this stage (d) being performed after stages (a) and (b), and the first and second processing temperatures being higher than the third processing temperature; and (e) thereafter etching away the active semiconductor film for the diode from over the etch-stop to leave the active semiconductor film for the diode over the interconnection film in the diode area.

By carrying out stages (a) and (b) before stage (d), such a method in accordance with the invention is advantageous for the TFT in permitting the achievement of good quality crystalline material for its channel area and of efficient source and drain regions, through the use of the higher first and second processing temperatures. Thus, for example, good polysilicon TFTs can be formed using laser crystallisation of the silicon film and laser annealing of source and drain dopant implants. The source and drain regions can be formed so as to be self-aligned with the gate electrode of the TFT. Although stages (a) and (b) may be used to provide a bottom-gate TFT, the invention is particularly useful with top-gate TFTs. The TFT may be advantageously hydrogenated after stages (a) and (b) and before the lower temperature stage (d).

By carrying out stage (d) with its lower processing temperature after the higher temperature stages, such a method in accordance with the invention is advantageous for providing the diode with a less crystalline material (for example, even an amorphous semiconductor material) in an appropriate thickness for the desired diode characteristics. Thus, for example, efficient photodiodes of a vertical PIN structure can be formed with an intrinsic hydrogenated amorphous silicon (aSi:H) film that is thicker than the polysilicon film of the TFT. Furthermore, de-hydrogenation of this diode film (which would occur if the higher temperature process stages (a) and (b) were carried out subsequently) is avoided by performing these higher temperature process stages (a) and (b) before providing the aSi:H film of the diode. The resulting diode may advantageously exploit a hybrid of amorphous and polysilicon technologies Furthermore, by depositing and etching the active semiconductor film for the diode over the etch-stop film (as well as over the interconnection film), the layout of this semiconductor film in the diode area can be defined without undesirable etching of other parts of the device such as the TFT and its interconnection to the diode. Such a method in accordance with the invention permits the use of some common films for the TFT and the diode. Thus, for example, the interconnection film can form gate or source/drain connections to the TFT and/or a bottom connection to the diode, whereas another film may provide a top connection to the diode in, for example, a display pixel layout. The interconnection film may even provide the gate electrode or source and drain regions of the TFT and/or an electrode region of the diode. In this manner, the height of stepped increases in the topography due to the integration of a thick vertical diode can be reduced. This reduces problems, for example, in providing transparent display-pixel electrodes over the integrated diode and TFT structure.

Several basic variants are possible depending on the nature and arrangement of the etch-stop and interconnection films.

In one form, the interconnection film may comprise metal which itself provides the etch-stop film. In this case, the diode may have a vertical PIN diode structure formed in its active semiconductor film (as an intrinsic region between P and N electrode regions) deposited on the metal film.

In another form, for example, the etch-stop film may be an insulating film that extends over the interconnection film and that has a window at the diode area to permit contact between the interconnection film and the active semiconductor film of the diode. With this form, the interconnection film may be of metal. However, with this form of etch-stop film, the interconnection may even be of semiconductor material that provides a bottom one of the electrode regions of the diode (for example, a P+ or N+ doped region of a PIN diode). Thus, such a semiconductor electrode/interconnection film of the diode can be adequately protected by the insulating etch-stop film during the etch-definition of the diode layout. This permits the provision of novel device structures.

Thus, according to another aspect of the present invention, there is provided an electronic device comprising thin-film circuit elements that include a diode integrated with a crystalline thin-film TFT, wherein:
- the TFT has at least one of its source, drain and gate formed as a doped region of a crystalline semiconductor film that is more crystalline than an active semiconductor film of the diode;
- the doped region of the crystalline semiconductor film extends from the TFT to provide a bottom electrode region of the diode that is thereby interconnected with the said one of the TFT source, drain and gate; and
- the diode has its said active semiconductor film on the crystalline semiconductor film at a window in an insulating etch-stop film that extends over the crystalline semiconductor film and over at least a portion of the crystalline TFT, the active semiconductor film of the diode having a lateral extent that terminates on the insulating etch-stop film.

Various advantageous features and feature-combinations in accordance with the present invention are set out in the appended claims. These and others are illustrated in embodiments of the invention that are now described, by way of example, with reference to the accompanying diagrammatic drawings, in which:

Figure 1:
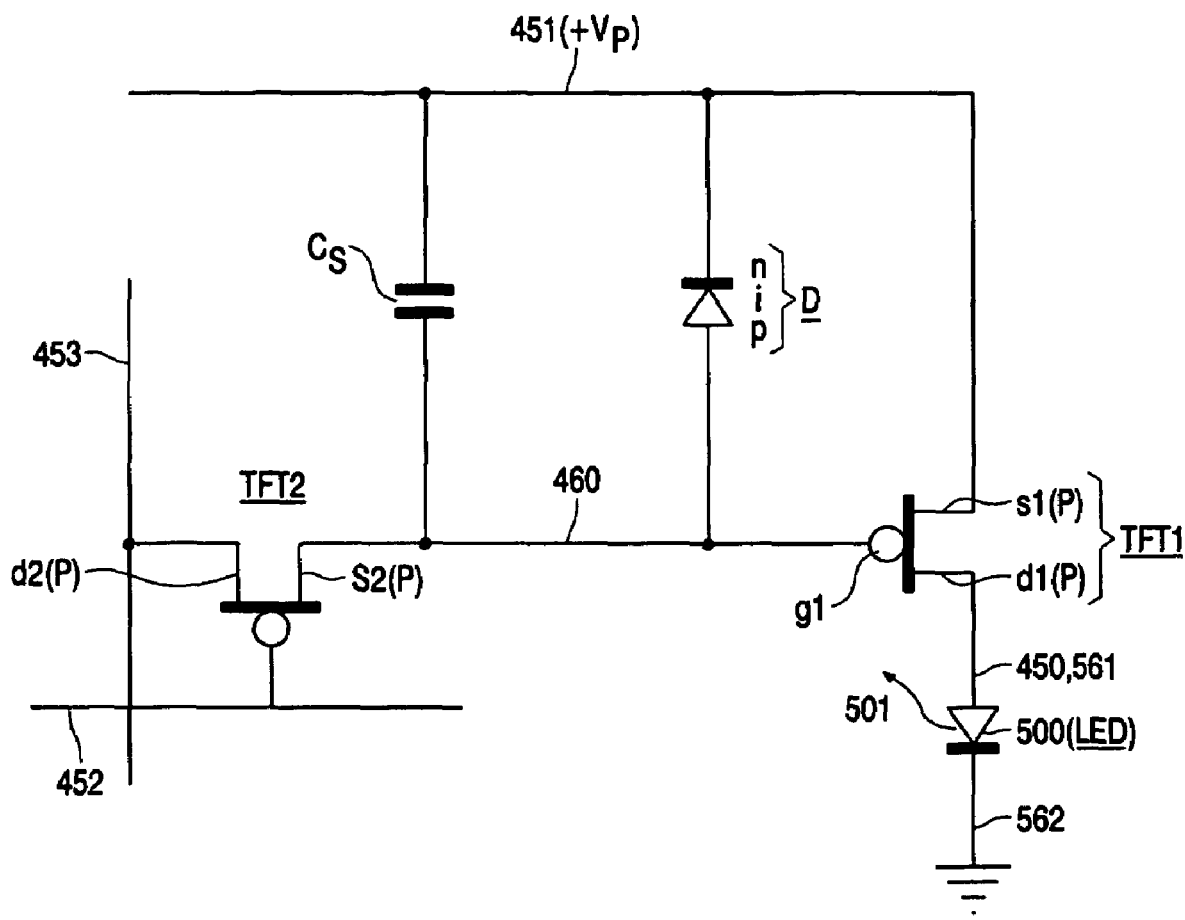
FIG. 1 is a circuit diagram of a pixel circuit of an active-matrix electroluminescent display device, illustrating an example of the context in which the present invention can be used.

It should be noted that all the Figures are diagrammatic. Relative dimensions and proportions of parts of these Figures have been shown exaggerated or reduced in size, for the sake of clarity and convenience in the drawings. The same reference signs are generally used to refer to corresponding or similar features in modified and different embodiments.

FIG. 1 EXAMPLE OF THE DISPLAY PIXEL CIRCUIT

The circuit of FIG. 1 illustrates just one pixel of a pixel array of an active-matrix electroluminescent display device of the general type that is disclosed in, for example, WO-A-01/20591, WO-A-01/99190 and WO-A-01/99191. FIG. 1 illustrates a particularly simple example of pixel circuit, whereas other more complex pixel circuits with more than two TFTs are also known. It will be understood that the present invention may be applied not only to the simple circuit of FIG. 1, but also to these more complex pixel circuits.

As illustrated in FIG. 1, each pixel comprises:
- a light-emitting element 500, typically a light-emitting diode (LED) of organic semiconductor (for example, polymer semiconductor),
- at least, two polysilicon thin-film transistors (namely a drive TFT1 and an address TFT2), whereby the LED 500 is driven via the drive TFT1 as addressed via the address TFT2,
- a thin-film storage capacitor Cs for storing the drive signal applied to the gate of drive TFT1 via address TFT2, and
- an amorphous PIN photodiode D that is responsive to the light output 501 of the LED 500 and is used for regulating the operation of the LED 500 via drive TFT1 in order to counteract aging effects in the LED 500.

The present invention is illustrated in its application to the integration of a thick, vertical amorphous PIN photodiode D with drive TFT1 and/or address TFT2. As shown in FIG. 1, this thin-film diode D is connected between power supply line 451 and an internal conductor line 460, in parallel with the capacitor Cs. The power supply line 451 (+Vp) is connected to the source s1 of the drive TFT1), as well as to the PIN diode D and to the capacitor Cs. The conductor line 460 is connected to both the gate g1 of drive TFT1 and the drive signal output (source s2) of the address TFT2, as well as to the PIN diode D and to the capacitor Cs. The address TFT2 has its gate g2 connected to a respective row conductor 452 of the array, and its drain d2 is connected to a respective column conductor 453 of the array. The pixel layout is such that the photodiode D receives part of the light output 501 from its respective pixel, without the pixel aperture being obscured by the capacitor Cs, TFTs TFT1 and TFT2 and their connection conductors.

Thus, the process stages used for the integration of these thin-film circuit elements D, Cs, TFT1, TFT2 on a circuit substrate 100 need to be compatible with the complex pixel context of the display device. The present invention permits integration of the amorphous PIN diode D with polysilicon transistor TFT1 and/or TFT2, in a manner that permits a good degree of optimisation of the respective properties of the diode D and TFT, while using common process steps for their integration. Generally, the same polysilicon TFT technology and same process steps may be used to fabricate both TFT1 and TFT2 side-by-side on the circuit substrate 100, but with different TFT layouts and different connection layouts for each TFT.

Several specific embodiments for the integration of the diode D with these TFTs are now described with respect to the FIGS. 2 to 13. Each specific embodiment includes the stages of:

(a) forming on the circuit substrate 100 a crystalline active semiconductor film 10 for the channel areas 1 of the TFTs TFT1 and TFT2, with a first process involving a first processing temperature;

(b) forming doped source regions s1,s2 and drain regions d1,d2 of the TFTs at ends of the channel area, with a second process involving a second processing temperature;

(c) providing an interconnection film 20 between an electrode area of one of the TFTs and a diode area over which the diode D is to be formed, and providing an etch-stop film 30 on which an active semiconductor film 40 for the diode is to be deposited;

(d) thereafter depositing the active semiconductor film 40 for the diode D over the interconnection film 20 and the etch-stop film 30 with a third process that involves a third processing temperature, this stage (d) being performed after stages (a) and (b), and the first and second processing temperatures being higher than the third processing temperature; and (e) thereafter etching away the active semiconductor film 40 for the diode D from over the etch-stop film 30 to leave the active semiconductor film 40 for the diode over the interconnection film 20 in the diode area.

Such a device manufacturing method in accordance with the invention is advantageous for providing the TFT with good quality crystalline material for its channel area and with efficient source and drain regions. This is achieved through the use of the higher first and second processing temperatures in stages (a) and (b). By carrying out stage (d) with its lower third processing temperature after stages (a) and (b), such a method is also advantageous for providing the diode D with a less crystalline material 40 (preferably even an amorphous semiconductor material) in an appropriate film thickness for the desired diode characteristics. By depositing and etching the active semiconductor film 40 for the diode D over the etch-stop film 30 (as well as over the interconnection film 20), the layout of this semiconductor film 40 in the diode area can be defined without undesirable etching of other parts of the device such as the TFT and its interconnection to the diode D.

Such a method in accordance with the invention permits the use of one or more common films for the diode D and TFT1 and/or TFT2, depending on the nature and arrangement of, for example, the interconnection film 20 and the etch-stop film 30. Various specific embodiments will now be described.

EMBODIMENT OF FIGS. 2 TO 7

Figure 2:
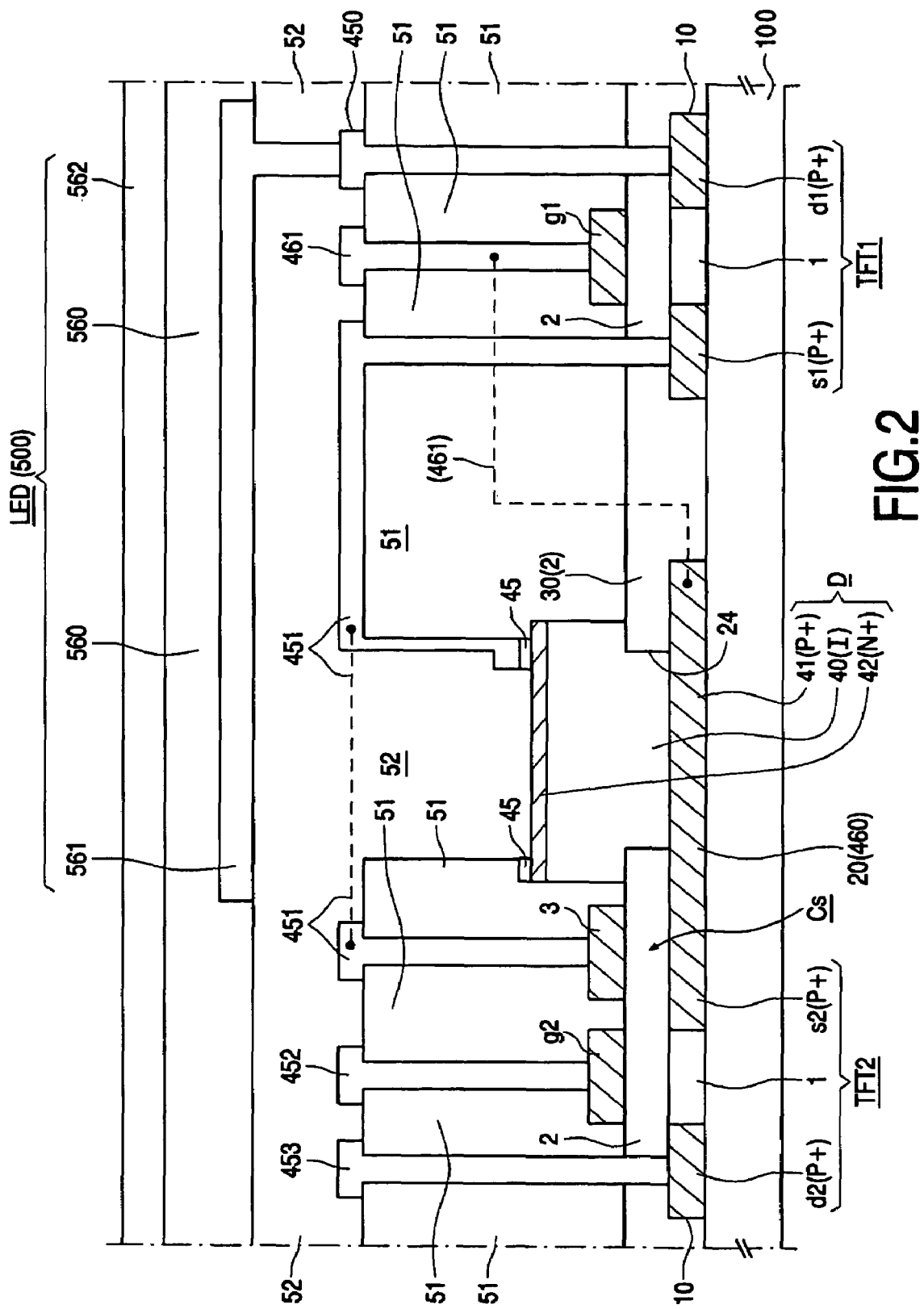
FIG. 2 is a cross-sectional view of parts of one pixel structure formed on a circuit substrate of such an active-matrix electroluminescent display device, in one particular embodiment of the invention.

FIG. 2 illustrates the pixel structure of one embodiment of a display device as manufactured by a first embodiment of a method in accordance with the invention.

Polysilicon TFT1 and TFT2 each comprise an island of a crystalline silicon film 10 that provides each TFT with its respective channel area. Both the TFT1 island and TFT2 island are shown in FIG. 2, being artificially constrained into the plane of the drawing. In a practical pixel layout, TFT1 and TFT2 would normally be in different cross sections. Both these TFTs are themselves of a known top-gate configuration which has its respective gate electrode g1,g2 on a gate dielectric film 2 on the silicon film 10 and which has its respective source s1,s2 and drain d1,d2 formed as doped regions of the film 10. In this embodiment, the source s1,s2 and drain d1,d2 of both TFTs have a p-type doping (P+), and both the TFTs are p-channel.

The address TFT2 has its gate g2 connected to row metallisation 452 of the array, and its drain d2 connected to column metallisation 453 of the array. Its source s2 is connected by internal conductor line 460 to the capacitor Cs, to the photodiode D, and (also via metallisation 461) to the gate g1 of the drive TFT1. The drive TFT1 has its drain d1 connected by metallisation 450 to the bottom transparent (ITO) electrode 561 of the pixel LED 500. As shown in FIG. 2, these connections to metallisation pattern 450, 451, 452, 453, 461 (for example of aluminium) are made via contact windows in an inter-level insulating layer 51. A further insulating layer 52 separates this metallisation pattern from the LED pixels, except at a window where the transparent display-pixel electrode 561 is connected to the TFT1 drain metallisation 450.

The present invention reduces the height of stepped increases in the topography due to the integration of the thick vertical PIN diode D. This reduces problems in providing the transparent display-pixel electrodes 561 over the integrated diode and TFT structure. The light-emitting semiconductor polymer film 560 of the pixel LED 500 is sandwiched between this electrode 561 and a grounded cathode electrode 562.

Furthermore, the present invention (as implemented in the embodiment of FIG. 2) provides the interconnection film 20 in an advantageous manner for the conductor line 460, connecting the diode D and the source s2 of address TFT2. Thus, in this embodiment, a P+ doped track region of the polysilicon film 10 is used to provide this interconnection film 20 (conductor line 460).

Furthermore, a P+ region of this same film 10,20 may also provide the bottom plate of capacitor Cs. This use of the film 10,20 for the bottom plate of capacitor Cs is illustrated in the FIG. 2 embodiment. In this particular example, the top plate 3 of capacitor Cs is illustrated as a separate area of the film that provides the TFT gates g1,g2. Thus, the gate dielectric film 2 may also provide the capacitor dielectric.

Thus, as illustrated in FIG. 2, a continuous P+ doped track of polysilicon film 10 forms the doped source s2 of TFT2, the bottom plate of capacitor Cs, the bottom electrode region 51 of PIN diode D, and their interconnection 20. The gate g1 of TFT1 is connected to this P+ polysilicon track.

The remainder of the PIN diode D of FIG. 2 is formed on this polysilicon P+ region 51 by etch-defined regions 40 and 42 of a thick amorphous intrinsic silicon film and of a thinner amorphous N+ doped silicon film. In this embodiment, the etch-stop film 30 used during the etch definition of the diode D is provided by an extension of the gate-dielectric film 2. A metal film (for example of chromium) for the top contact 45 may be present over the diode area during this etching stage, and its contact area (and obscuration) on the diode region 42 can be restricted later (for example, after defining the metallisation pattern 450, 451,452,453,461).

Figure 3:
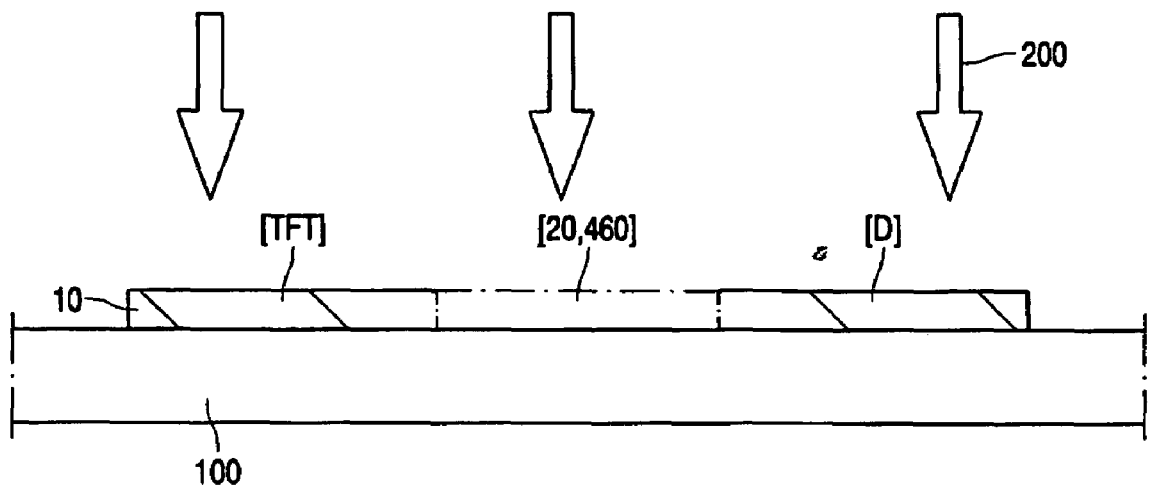
FIGS. 3 to 7 are a cross-sectional view of a TFT and diode part of a pixel structure similar to that of FIG. 2 at successive stages in its manufacture by a method in accordance with the invention.

FIG. 3 illustrates stage (a) in the manufacture of this embodiment. The substrate 100 is typically of a low-cost insulating material (for example glass, or perhaps even an insulating polymer), having an insulating coating of, for example, silicon dioxide or silicon nitride providing its upper surface on which the circuit elements are formed. A silicon film 10 initially of amorphous material is deposited for the TFT islands and is crystallised in known manner by heating with a laser beam 200. Typically, an excimer laser may be used, with a laser energy and pulse rate sufficient to melt the film 10 through most of its thickness. The silicon film 10 typically reaches temperatures in the range of 1000° C. to 1400° C. (depending on its hydrogen content) during this laser treatment.

FIG. 3 depicts three parts to this film 10, namely part [TFT] where a TFT (TFT1 or TFT2) will be formed, part [D] where the diode D will be formed, and part [20,460] where the TFT-diode interconnection will be formed. It should be noted that the FIG. 3 cross-section shows the part [20,460] in link-dot outline to indicate that this part [20,460] of the film 10 is out of the plane of the drawing. This cross-section is more realistic for a display pixel layout than that of FIG. 2, in which both TFT1 and TFT2, the diode D and the interconnection 20,460 were all constrained into the plan of the drawing. In the case where the part [TFT] of FIG. 3 is for TFT2, the part [20,460] of the film 10 extends out of the plane of the drawing while remaining integral with the parts [TFT] and [D] which are in the plan of the drawing. In a case where the part [TFT] is for TFT1, the part [20,460] of the film 10 is not integral with this [TFT] part of FIG. 3, but only with the part [D] which is in the plan of the drawing.

In order to simplify the description for the subsequent FIGS. 4 to 7, it will be assumed that FIG. 3 shows the [TFT] part of TFT2, that the separate TFT1 island of the film 10 is also out of the plane of the drawing, and that TFT1 is fabricated with the same process steps as the depicted TFT2.

Figure 4:
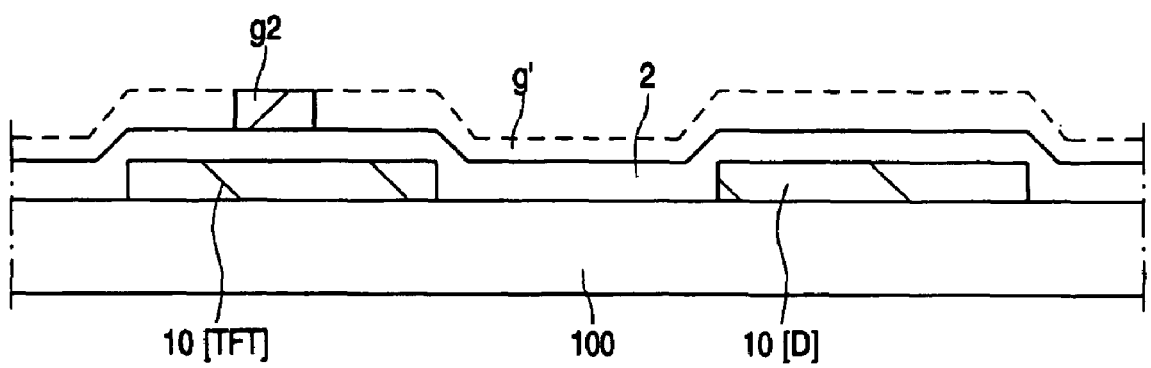

FIG. 4 illustrates a subsequent stage in the manufacture, after deposition of the gate-dielectric film 2 and a film g' of metal. Typically, the film g' may be of, for example, aluminium, or chromium, or silicide or another material or alloy commonly used for TFT gate electrodes. The gates g1 and g2 are defined from the film g' with normal photolithographic and etching techniques.

Figure 5:
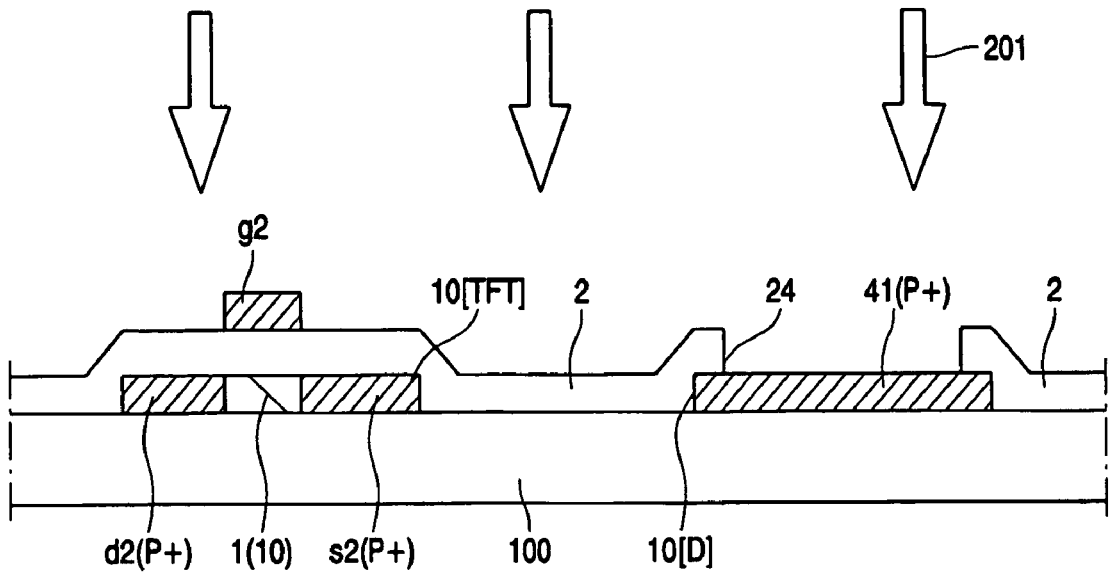

FIG. 5 illustrates the later stage (b), in which the P+ regions s1,s2, d1,d2, 20(460) and 41 are formed in the polysilicon film 10. These P+ regions are formed by implanting boron ions in the film 10 (except where masked by the gates g1 and g2 and any additional mask feature) and then heating to anneal the implantation damage and activate the boron dopant. This heating step may be performed with a laser beam 201. During such laser treatment, the temperature of exposed areas of the silicon film 10 typically exceeds 900° C. Instead of a laser beam, a rapid thermal anneal (RTA) using high-intensity light 201 may be used for this heat treatment. In this case, the exposed areas of the silicon film 10 typically reach a temperature in the range of 600° C. to 900° C. In a further alternative, a furnace anneal in the range of 350° C. to 600° C. may be used. A combination of these heating treatments may even be used. Multiple implants may also be used to form differently doped regions, for example, in a LDD (low-doped drain) structure.

These stages (a) and (b) of FIGS. 3 and 5 with their high processing temperatures are very advantageous for the TFTs, in the achievement of good quality crystalline material for their channel area and of efficient source and drain contacts. Furthermore, by using the gate electrodes g1 and g2 as implantation masks, the P+ source and drain regions s1,s2 and d1,d2 are self-aligned with their gate electrode g1,g2.

Either before or after this doping stage (b), a window 24 is opened in the film 2 at the area where the PIN diode D is to be formed. This window 24 permits contact between the interconnection film 20 (polysilicon film 2 in this embodiment) and the subsequently-deposited active diode film (amorphous intrinsic film 40 in this embodiment).

It is desirable to hydrogenate the polysilicon TFTs after depositing their gate dielectric 2 (i.e. after FIG. 4). This hydrogenation stage is another treatment at a moderately high temperature, and so it is carried out before depositing the amorphous silicon material for the diode D. It may typically be a thermal anneal at 300° C. to 400° C. in $N_2/H_2$ gas (10% $H_2$), or it may be a hydrogen plasma exposure at 300-400 C, or a combination of both. Preferably, it should be performed after providing the gate metal and activating the dopant since any damage introduced by these two processes can then be passivated by the hydrogen. Therefore, preferably, this hydrogenation is performed after stages (a) and (b) and before stage (d), and it may be the very last process that is performed before the a-Si deposition stage (d).

Figure 6:
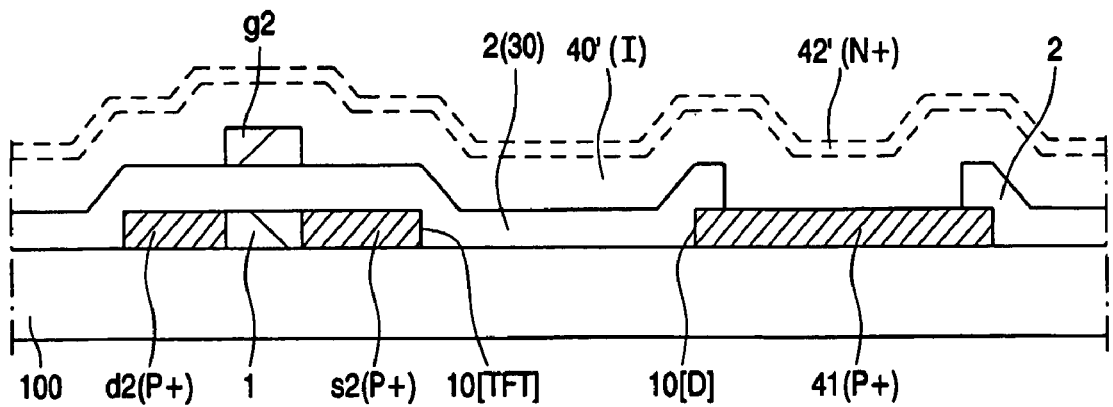
Figure 7:
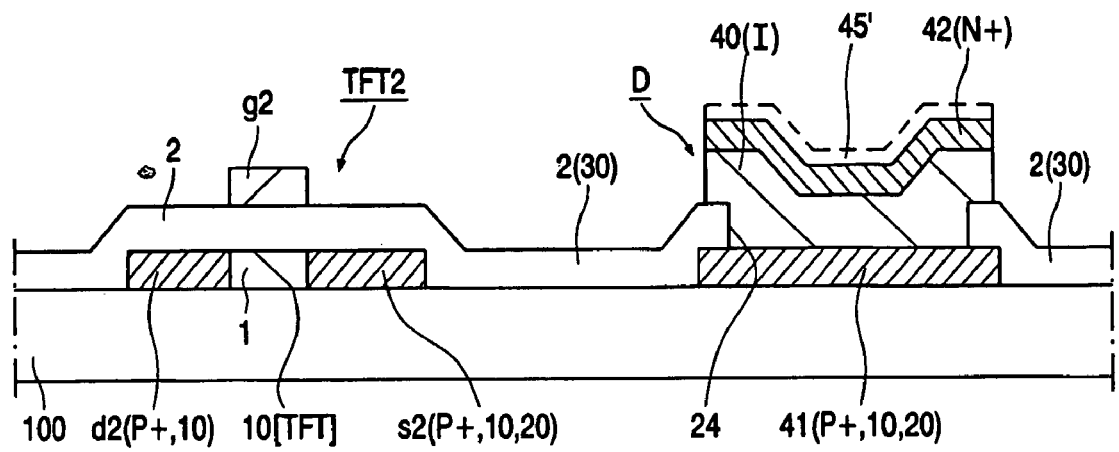

FIG. 6 illustrates the subsequent deposition stages for the PIN diode D, when an un-doped amorphous hydrogenated silicon film 40' is deposited for the intrinsic region 40(I) of the PIN diode D, followed by an N+ doped amorphous silicon film 42' for the N+ region 42. These amorphous films 40' and 42' are typically deposited at a temperature in the range 100° C. to 300° C. By carrying out this stage (d) with its lower third processing temperature after stages (a) and (b), the photodiode D can be formed as a vertical PIN diode structure with a good quality intrinsic amorphous semiconductor region 40 in an appropriate thickness for the desired diode characteristics.

Thus, the thickness of the un-doped amorphous silicon film 40' is chosen as desired for efficient absorption of the LED output 501 by the intrinsic region 40(I) of the PIN diode D, even at the red end of the spectrum. In a typical embodiment of an active matrix electroluminescent colour display, efficient PIN photodiodes can be formed with an intrinsic amorphous silicon film that has a thickness in the range of, for example, 0.5 µm to 1.0 µm. This is much thicker than the polysilicon film 10 of the TFTs, which may have a thickness in the range of, for example, 0.04 µm to 0.10 µm.

Thereafter, the lateral dimensions of the PIN diode D are defined in the films 42' and 40' with normal photolithographic and etching techniques, but using the gate-dielectric film 2 as an etch-stop 30. Thus, this etch-stop film 2,30 prevents undesirable etching of other parts of the device, such as the polysilicon film 10 that forms the TFT islands and the interconnection 20,460 to the diode D. During this etching step, a top metal film 45' (for example of chromium) may be present over the diode area as at least part of the etchant mask. Its lateral extent can be restricted at a subsequent stage (after defining the metallisation pattern 450, 451, 452, 453, 461) to give the desired contact area (and edge-only obscuration) of the top metal contact 45 on the diode region 42.

Two unusual aspects of this embodiment are to be seen in the resulting structure of PIN diode D, namely:
  dielectric layer 2,30 is interposed between the edge of the P+ lower electrode region 41 of the PIN diode D and its intrinsic region 40, and
  the P+ lower electrode region 41 of this amorphous PIN diode is formed in the polysilicon film 10, i.e. a hybrid of technologies.

The number of process steps and mask steps is reduced by using in this way common films 10 and 2,30 in the TFT and diode and for the interconnection and etch stop. Thereafter, the manufacture of the device is continued in known manner.

In this embodiment, the TFT gates g1 and g2 were provided before the source/drain formation stage (b) so producing a self-aligned structure. However, the present invention may be used with non-self-aligned TFTs, in which the channel area of the film 10 is masked with, for example, photoresist during the dopant implant of the source/drain formation stage (b). Thereafter, the TFT gates g1 and g2 can be provided, for example with the same metallisation film as used for a top metallisation 420 of the PIN diode D. A separate part of this gate metallisation film may even form, for example, an interconnection between the top metallisation 420 of the PIN diode D and the source s1 of the drive TFT1.

EMBODIMENT OF FIG. 8

Figure 8:
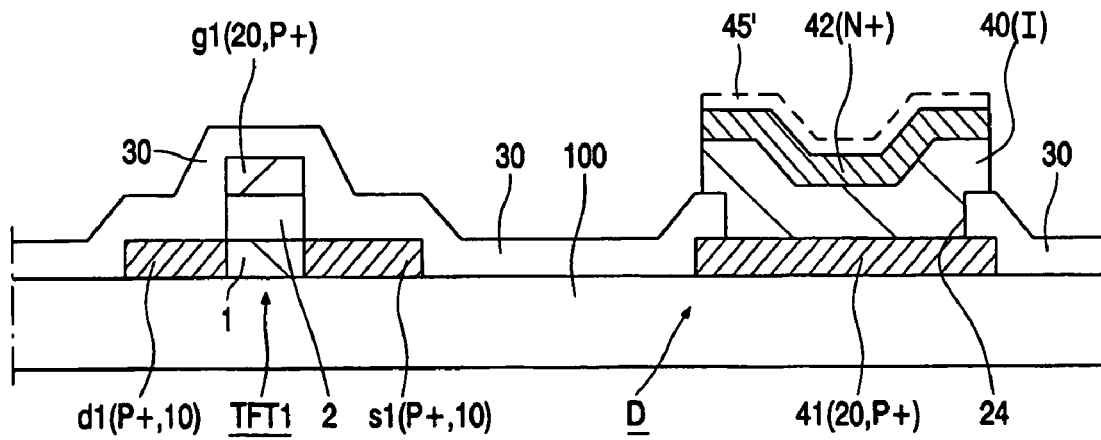
FIGS. 8 to 13 are cross-sectional views during manufacture, of a TFT and diode part of other pixel structures that can be manufactured by other respective methods in accordance with the invention.

In the embodiment of FIGS. 2 to 7 the interconnection film 20 and the bottom electrode region 41 of the diode D are formed in the polysilicon film 10 that provides TFT channel areas. FIG. 8 illustrates a modified embodiment, in which a different interconnection film 20 provides doped-silicon gates g1 and g2 of the TFTs and the bottom electrode region 41 of the diode D. In this case, the gate-dielectric film 2 is not used as the etch stop film 30. This different interconnection film 20 provides the conductor line 460 connecting the diode D with the gate g1 of drive TFT1. FIG. 8 shows the TFT1.

In this FIG. 8 embodiment, the TFT polysilicon film 10 is formed by laser crystallisation, as in FIG. 3. After depositing thereon the gate-dielectric film 2, the interconnection film 20 is deposited and patterned by photolithography and etching. Thus, in this embodiment, the film 20 provides both a gate film g' for the TFTs and the bottom electrode region 41 of the diode D. As was the case for the interconnection of FIGS. 3 to 7, the interconnection itself between the gate g1 of TFT1 and the bottom electrode region 41 of diode D is outside the plane of the FIG. 8 drawing, which simply shows regions g1 and 41 at its ends.

In the FIG. 8 embodiment, this film 20 (forming the interconnection itself, the TFT gate g1 and the diode bottom electrode region 41) may be doped P+ in the same boron doping stage (b) as is used to form the doped regions s1,s2 and d1,d2 of the TFTs. Thus, the TFTs may still be of the self-aligned type. Thereafter, the thin-film structure is covered with an insulating film 30 which is to provide the etch-stop (instead of using an extension of the gate-dielectric film 2), and the contact window 24 is etched therein at the diode area. Thereafter the manufacture is continued as in the embodiment of FIGS. 2 to 7.

EMBODIMENT OF FIG. 9

Figure 9:
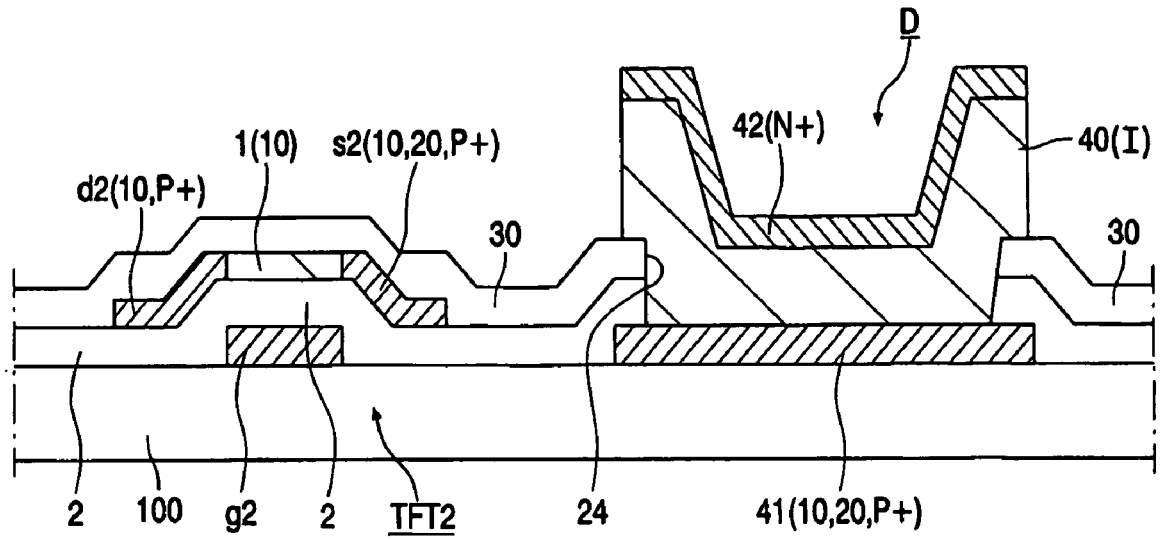

The embodiments so far illustrated have top-gate TFTs. FIG. 9 illustrates an embodiment with bottom-gate TFTs. In this embodiment (as in FIGS. 2 to 7), the polysilicon film 10 provides the interconnection 20,460 between the TFT2 and bottom electrode region 41 of the diode D, as well as providing the channel area of the TFTs.

The bottom gates g1 and g2 of the TFTs are formed (by film deposition, photolithography and etching) on the substrate 100, before stage (a) of the process. These gates g1 and g2 may be of metal or doped polysilicon. Then the gate-dielectric film 2 is deposited, followed by the silicon film 10.

By photolithography and etching, the film 10 is patterned into the required areas for the TFT islands, the bottom electrode region 41 of the diode D, and the desired interconnection 20,460 between regions s2 and 41. As was the case in FIGS. 3 to 8, the interconnection itself is outside the plane of the FIG. 9 drawing, which simply shows regions s2 and 41 at its ends. The film 10 is converted to polysilicon material by laser crystallisation, as in FIG. 3.

The P+ doping of the TFT regions s1,s2 and d1,d2 and the interconnection 20 and the diode region 41 is then provided by boron ion implantation and laser annealing, similar to FIG. 5 (except that the gates g1 and g2 are now below the film 10). This P+ doping may be performed either before or after depositing the insulating etch-stop film 30. The contact window 24 is etched through both the film 30 and the film 2 in this embodiment, either before or after this P+ doping stage. Thereafter the manufacture is continued as in the embodiments of FIGS. 2 to 8.

EMBODIMENT OF FIG. 10

Figure 10:
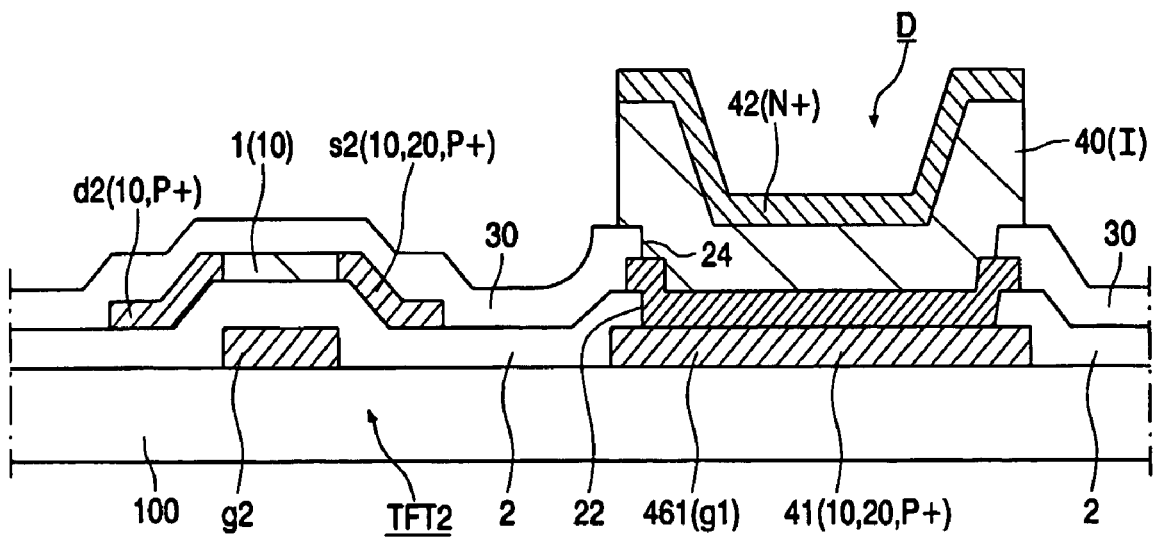

The embodiment of FIG. 10 is similar to that of FIG. 9, except that a metal conductor 461 is formed at the diode area in the same processing steps as used to provide metal bottom-gates g1 and g2 of the TFTs. This metal conductor 461 may be an extension of the gate g1 of TFT1, so as to connect the interconnection 20,460 (via region 41) with the gate g1 of TFT1. In this case, a contact window 22 is opened in the gate-dielectric film 2 at the diode area before depositing the silicon film 10. The metal conductor 461 contacts through this window 22 the diode region 41 that is subsequently formed in the polysilicon film 10 as in the embodiments of FIGS. 5 and 9. Thereafter the manufacture is continued as in the embodiments of FIGS. 2 to 9.

EMBODIMENT OF FIG. 11

Figure 11:
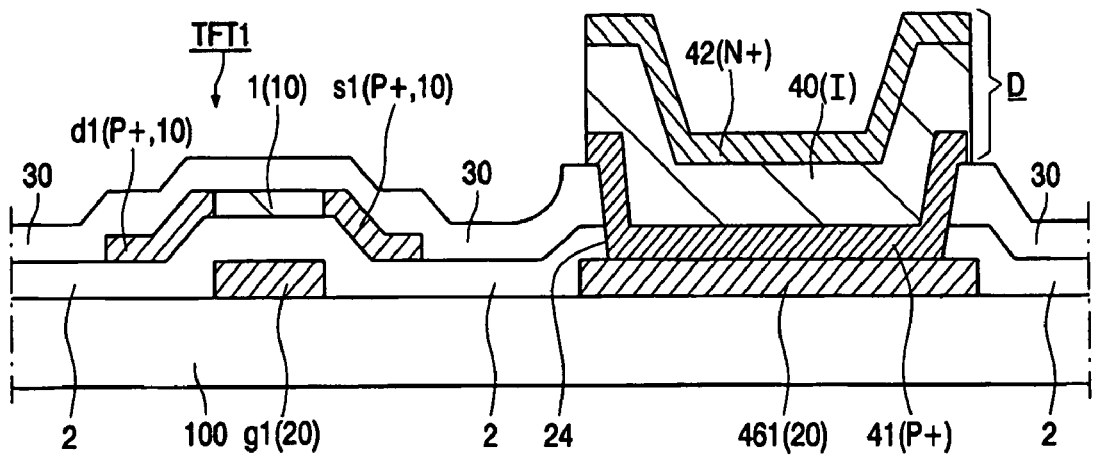

The embodiment of FIG. 11 also comprises the metal conductor 461 formed at the diode area in the same processing steps as used to provide metal bottom-gates g1 and g2 of the TFTs. However, FIG. 11 shows TFT1 instead of TFT2. In this case, the metal conductor 461 may be an integral part of a different interconnection film 20 (now of metal) that provides the conductor line 460 between the bottom gates g1 of the TFT1, the bottom connection 461 to the diode D, and the bottom plate of capacitor Cs.

The further manufacturing stages may be similar to those of FIG. 10, in that the bottom P+ region 41 of the PIN diode D may be formed by a region of the TFT polysilicon film 10. However, FIG. 11 illustrates a further modification in which the bottom P+ region 41 of the PIN diode D is deposited after deposition of the insulating etch-stop film 30. In this case, contact window (between metal conductor 461 and diode region 41) is etched through both the insulating films 30 and 2 before depositing a P+ film 41' (for the diode region 41), the intrinsic film 40' (for the I region 40) and the N+ film 42' or the diode region 42). In this case, the P+ region 41 may be of amorphous silicon material.

EMBODIMENT OF FIG. 12

Figure 12:
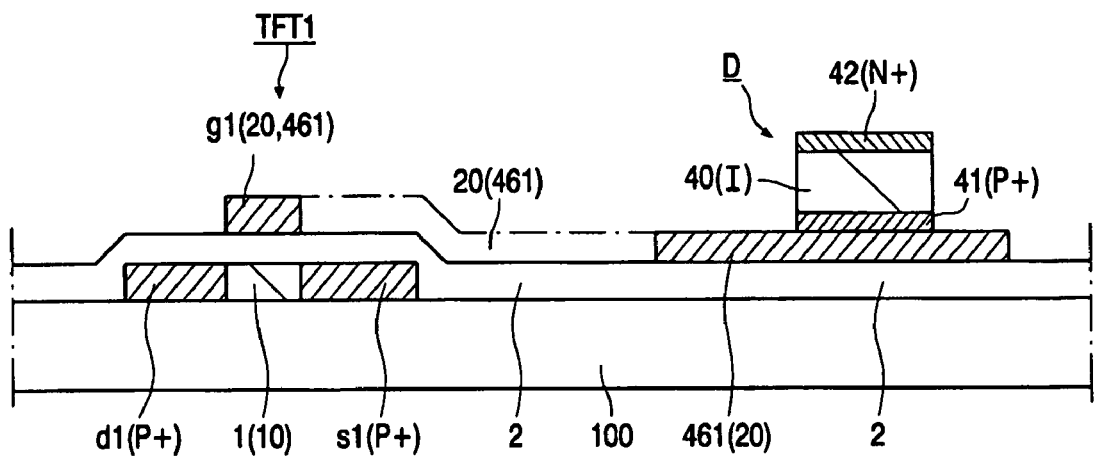

This embodiment is similar to that of FIG. 11, in that the interconnection of gate g1 of the drive TFT1 with the diode P+ region 41 is via a metal film g1,20,461. However, in the FIG. 11 embodiment, the TFTs are of the top-gate type. Thus, FIG. 12 shows the metal gate g1 (and metal conductor 461) on the gate-dielectric film 2 that is deposited over the polysilicon active film 10 of the TFTs. FIG. 12 depicts three parts to this metal film g1,20,461, namely part g1 (the gate of TFT1), part 461 where diode D will be deposited, and part 20 which represents their interconnection. This interconnection part 20 of the film is shown in link-dot outline in FIG. 12 to indicate that it extends out of the plane of the drawing, while remaining integral with the parts g1 and 461 which are in the plan of the drawing.

In this embodiment, no additional etch-stop film 30 is needed when etch-defining the lateral extent of the amorphous diode regions 42,40,41. Thus, the silicon etch will stop at the surface of the metal film g1,20,461 and at the surface of the gate-dielectric 2.

EMBODIMENT OF FIG. 13

Figure 13:
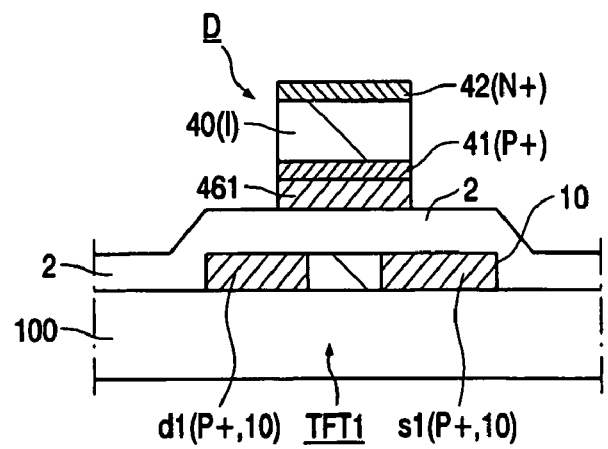

In the embodiments of FIGS. 11 and 12, a metal interconnection film g1,20,461 provides the gates g1 and g2 of the TFTs and the electrode connection to diode region 41. The diode D was provided beside the TFTs. FIG. 13 illustrates a modification in which the diode D can be provided on and/or as the gate g1 of TFT1. A very compact structure results.

In the FIG. 13 embodiment, stages (a) and (b) are first carried out to form the doped source and drain regions in the polysilicon film 10. This doping may be done before or after depositing and patterning the metal film 20,461 for the gate electrodes g1 and g2 and any desired interconnect. Thereafter a stack of the amorphous silicon films 41', 40' and 42' is deposited over the gates g1,g2 and over the gate-dielectric film 2. These films 41', 40' and 42' have respective P+, I, and N+ conductivities for the PIN diode D. The films 41', 40' and 42' are then etched to leave the PIN diode over the channel area of the drive TFT1, i.e. on the gate g1 of TFT1. In this case, the gate dielectric film 2 and the metal film 20,461 (of g2 and any desired interconnect) serve as the etch-stop film.

In a modification of the FIG. 13 embodiment, the P+ film can be deposited directly on the gate dielectric film 2 and patterned to form the gate electrodes g1 and g2 and any desired interconnect. Thereafter, an insulating film 30 may be deposited and provided with contact window 24 at the diode area over the channel area of TFT1. Thereafter the amorphous silicon films 40' and 42' of I and N+ conductivities are deposited and etched away except from over the TFT1 where the PIN diode is thereby formed. During this etch-definition, the insulating film 30 serves as the etch-stop, protecting the underlying g2 and any interconnect in the P+ film 41', as in FIG. 8. However, in this modified embodiment of FIG. 13, the PIN diode D itself provides gate g1 of TFT1.

OTHER EMBODIMENTS HAVING OTHER FEATURES

In the embodiments of FIGS. 2 to 13, the crystallised material of the active silicon film 10 has been described as being "polycrystalline". However, laser crystallisation nowadays has become such an efficient process that the resulting crystal grains can have dimensions comparable to the dimensions of a TFT island. Thus, in practice, the film 10 in any given TFT island may actually be monocrystalline material, i.e. the TFT1 and/or TFT2 may have an active film 10 of (what may be termed) single-crystal polysilicon.

In the embodiments of FIGS. 2 to 13, the crystalline active silicon film 10 has been described as being formed by a two-stage process, i.e. deposition of an amorphous or micro-crystalline silicon film and then laser crystallisation to the desired crystal grain size. However, it is also possible to deposit the silicon film 10 directly as polycrystalline material. Thus, for example, polysilicon material can be deposited directly in stage (a) by the thermal decomposition of silane ($SiH_4$) in the temperature range 580° C. to 650° C. This temperature is still higher than that (for example, in the range 100° C. to 300° C.) used to provide the amorphous silicon active film 40' for the PIN diode D.

In the embodiments of FIGS. 2 to 13, the doped source and drain regions s1,s2 and d1,d2 have been formed by implanting dopant into previously un-doped regions of the active silicon film 10 of the TFT. However, it is also possible to deposit a doped extra polysilicon film for the electrode regions s1,s2,d1,d2,(41) etc, particularly for top-gate TFTs. This doped extra polysilicon film for the electrode regions s1,s2,d1,d2,(41) etc may be deposited and patterned (by photolithography and etching) either before or after the undoped active film 10. If provided before the film 10, the resulting top-gate TFT is sometimes termed a "staggered" configuration. If provided after the film 10, the resulting top-gate TFT is sometimes termed a "co-planar" configuration. In each case, the temperature (for example, in the range 580° C. to 650° C.) used to provide the doped film is still higher than that used to provide the amorphous silicon active film 40' for the PIN diode D.

In the embodiments of FIGS. 2 to 13, the PIN diode D was formed with amorphous silicon, particularly in its intrinsic region 40. The resulting diode has very suitable characteristics for photosensing visible light outputs of pixels in an active matrix colour display. However, the active diode film may be of, for example, micro-crystalline semiconductor material. This micro-crystalline diode structure can be integrated with a polysilicon TFT in accordance with the invention. Thus, the micro-crystalline film(s) of the diode can be deposited over one or more interconnection and etch-stop films with a processing temperature that is less than those earlier used for the polysilicon TFT in stages (a) and (b), after which the micro-crystalline film(s) can be etched away from over the etch-stop film to leave the active micro-crystalline film for the diode over the interconnection film in the diode area.

In the embodiments of FIGS. 2 to 13, the PIN diode D was formed with its P+ film 41 as the bottom electrode region. However, inverted PIN diode structures may be used (with appropriate polarity reversals) in which the N+ film 42 is the bottom electrode region of the PIN diode. The polysilicon TFTs may be n-channel having n-type source and drain regions s1,s2 and d1,d2. In this case, for example, the bottom (N+) electrode region of the PIN diode may be formed as part of an N+ track in the polysilicon film that provides the source s2 of the n-channel TFT2 or that provides the gate g1 of the n-channel TFT1.

In some pixel circuits with two polysilicon TFTs TFT1 and TFT2, one TFT may be n-channel while the other TFT may be p-channel. in this case, the TFT2 area is masked while implanting the s1,d1 dopant of one conductivity type for TFT1, and the TFT1 area is masked while implanting the s2,d2 dopant of opposite conductivity type for TFT2. Both of these dopant implants and their anneal are carried out before depositing the less crystalline and/or amorphous material 40 for the diode D.

From reading the present disclosure, other variations and modifications will be apparent to persons skilled in the art. Such variations and modifications may involve equivalent and other features which are already known in the design, manufacture and use of electronic devices comprising thin-film circuits and component parts thereof and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The invention claimed is:

1. A method of manufacturing an electronic device comprising thin-film circuit elements that include a diode integrated with a crystalline thin-film transistor, the transistor having a channel area in an active semiconductor film that is more crystalline than an active semiconductor film of the diode, comprising:
- forming on a circuit substrate the crystalline active semiconductor film of the transistor with a first process involving a first processing temperature;
- forming doped source and drain regions of the transistor at ends of the channel area with a second process involving a second processing temperature;
- providing an interconnection film between an electrode area of the transistor and a diode area over which the diode is to be formed, and providing an etch-stop film on which the active semiconductor film for the diode is to be deposited;
- depositing the active semiconductor film for the diode over the interconnection film and the etch-stop film with a third process that involves a third processing temperature, the first and second processing temperatures being higher than the third processing temperature; and
- etching away the active semiconductor film for the diode from over the etch-stop film to leave the active semiconductor film for the diode over the interconnection film in the diode area;
- wherein the diode has its active semiconductor film forming an intrinsic region between P and N electrode regions of a vertical PIN diode structure, and wherein the interconnection film comprises a doped region in a semiconductor film together with the doped source and drain regions of the transistor and a bottom one of the P and N electrode regions of the PIN diode.

2. The method of claim 1, wherein the etch-stop film is an insulating film that extends over the interconnection film and that has a window at the diode area to permit contact between the interconnection film and the active semiconductor film of the diode.

3. The method of claim 1, wherein regions of the crystalline active semiconductor film are doped to provide the source and drain regions of the transistor, the bottom one of the P and N electrode regions of the PIN diode, and the interconnection film therebetween.

4. The method of claim 3, wherein the electronic device comprises first and second crystalline thin-film transistors integrated with the PIN diode by the interconnection film, and wherein the interconnection film provides the bottom one of the P and N electrode regions of the PIN diode, the top gate electrode of the first transistor, and/or the source and drain regions of the second transistor.

5. The method of claim 4, wherein the electronic device comprises an active-matrix electroluminescent display with a light-emitting diode in each pixel, and wherein the light-emitting diode is driven via the first transistor as addressed via the second transistor.

6. The method of claim 1, wherein at least a portion of the interconnection film is provided on a gate-dielectric film on the crystalline active semiconductor film to form a doped-semiconductor top gate electrode of the transistor which is interconnected with the bottom one of the P and N electrode regions of the PIN diode.

7. The method of claim 6, wherein the PIN diode is formed on the gate-dielectric film on the crystalline active semiconductor film of the transistor.

8. The method of claim 6, wherein the electronic device comprises first and second crystalline thin-film transistors integrated with the PIN diode by the interconnection film, and wherein the interconnection film provides the bottom one of the P and N electrode regions of the PIN diode, the top gate electrode of the first transistor, and/or the source and drain regions of the second transistor.

9. The method of claim 1, wherein the interconnection film comprises metal which provides the etch-stop film, and the diode has a vertical PIN diode structure formed in its active semiconductor film as an intrinsic region between P and N electrode regions.

10. The method of claim 1, wherein the crystalline semiconductor film is subjected to a hydrogenation process.

11. The method of claim 1, wherein the crystalline semiconductor film is formed by crystallising a deposited semiconductor film using laser heating of the film.

12. The method of claim 1, wherein the doped source and drain regions are formed by an ion implant of dopant in the crystalline semiconductor film and by annealing the implanted dopant.

13. A method of manufacturing an electronic device comprising thin-film circuit elements that include a diode integrated, with a crystalline thin film transistor, the transistor having a channel area in an active semiconductor film that is more crystalline than an active semiconductor film of the diode, comprising:
- forming on a circuit substrate the crystalline active semiconductor film of the transistor with a first process involving a first processing temperature;
- forming doped source and drain regions of the transistor at ends of the channel area with a second process involving a second processing temperature;
- providing an interconnection film between an electrode area of the transistor and a diode area over which the diode is to be formed, and providing an etch-stop film on which the active semiconductor film for the diode is to be deposited;
- depositing the active semiconductor film for the diode over the interconnection film and the etch-stop film with a third process that involves a third processing temperature, the first and second processing temperatures being higher than the third-processing temperature; and
- etching away the active semiconductor film for the diode from over the etch-stop film to leave the active semiconductor film for the diode over the interconnection film in the diode area;
- wherein at least a portion of the interconnection film is provided on a gate-dielectric film on the crystalline active semiconductor film to form a top gate electrode of the transistor which is interconnected with a bottom one of the P and N electrode regions of the PIN diode.

14. The method of claim 13, wherein the PIN diode is formed on the gate-dielectric film on the crystalline active semiconductor film of the transistor.

15. The method of claim 14, wherein the electronic device comprises first and second crystalline thin-film transistors integrated with the PIN diode by the interconnection film, and wherein the interconnection film connects the bottom one of the P and N electrode regions of the PIN diode, the top gate electrode of the first transistor, and the source region of the second transistor.

16. The method of claim 13, wherein the electronic device comprises first and second crystalline thin-film transistors integrated with the PIN diode by the interconnection film, and wherein the interconnection film connects the bottom one of the P and N electrode regions of the PIN diode, the top gate electrode of the first transistor, and the source region of the second transistor.

17. The method of claim 16, wherein the electronic device comprises an active-matrix electroluminescent display with a light-emitting diode in each pixel, and wherein the light-emitting diode is driven via the first transistor as addressed via the second transistor.

* * * * *